(12) United States Patent
Koens et al.

(10) Patent No.: US 7,123,486 B1
(45) Date of Patent: Oct. 17, 2006

(54) MULTIPLE COMPONENT CONNECTOR PLANE FOR A NETWORK DEVICE

(75) Inventors: Paul John Koens, Carleton Place (CA); Martin Leslie White, Sunnyvale, CA (US)

(73) Assignee: Nortel Networks, Limited, St. Laurent (CA)

( * ) Notice: Subject to any disclaimer, the term of this patent is extended or adjusted under 35 U.S.C. 154(b) by 954 days.

(21) Appl. No.: 10/128,872

(22) Filed: Apr. 24, 2002

(51) Int. Cl.
*H01R 12/16* (2006.01)

(52) U.S. Cl. .......................................... 361/788; 439/61
(58) Field of Classification Search .................. 439/61; 361/413, 407, 788, 729; 710/102
See application file for complete search history.

(56) References Cited

U.S. PATENT DOCUMENTS

| | | | | |
|---|---|---|---|---|
| 5,006,961 A | * | 4/1991 | Monico ....................... | 361/788 |
| 6,015,300 A | * | 1/2000 | Schmidt et al. ................ | 439/61 |
| 6,163,464 A | * | 12/2000 | Ishibashi et al. ............ | 361/788 |
| 6,202,110 B1 | * | 3/2001 | Coteus et al. ................ | 710/301 |
| 6,496,376 B1 | * | 12/2002 | Plunkett et al. ............. | 361/729 |

* cited by examiner

*Primary Examiner*—Hassan Kizou
*Assistant Examiner*—Albert T. Chou
(74) *Attorney, Agent, or Firm*—John C. Gorecki

(57) ABSTRACT

A network device uses a multiple component connector plane to interconnect functional cards within the network device. Each of the components of the connector plane may be configured to contain a subset of the total interconnectivity of the connector plane and, optionally, to interconnect one or more subsets of the functional cards in the network device. The reduced connectivity of each component enables each component to be made in a less complex fashion. Using printed circuit board technology, this reduction in complexity enables lower layer count boards to be used to form the connector plane, resulting in lower overall costs. The connector plane may be a mid-plane or a backplane.

20 Claims, 8 Drawing Sheets

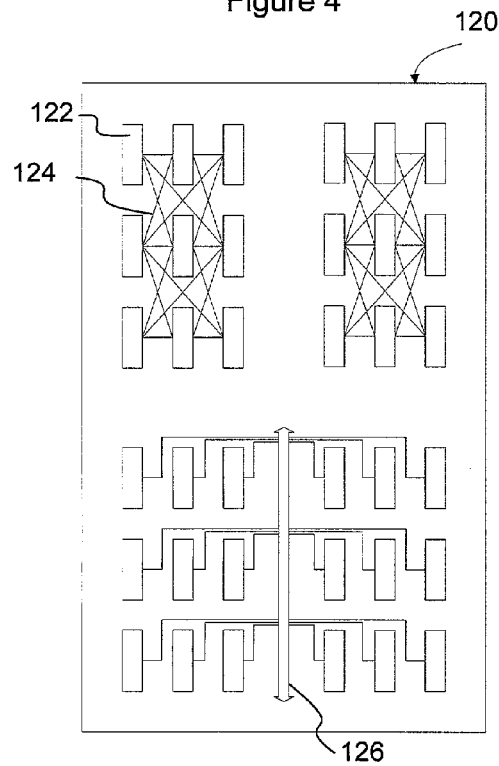
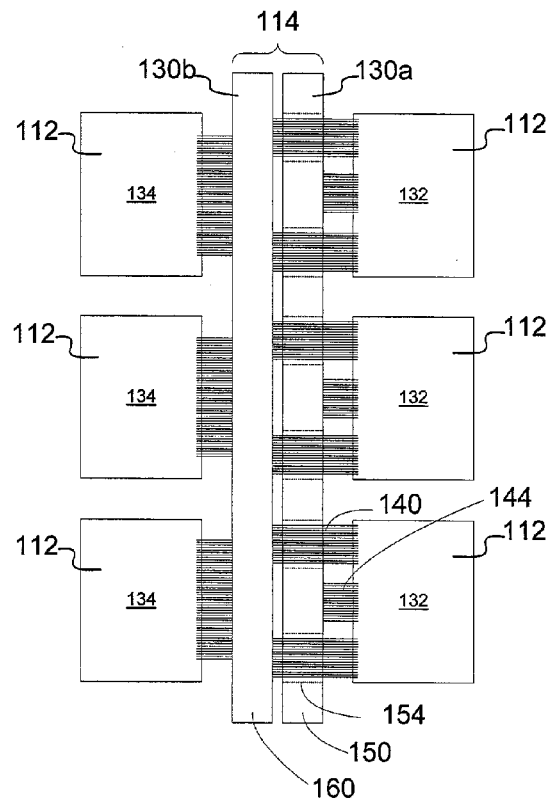
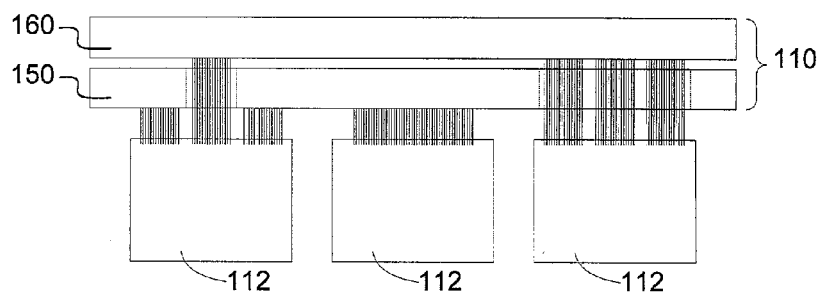

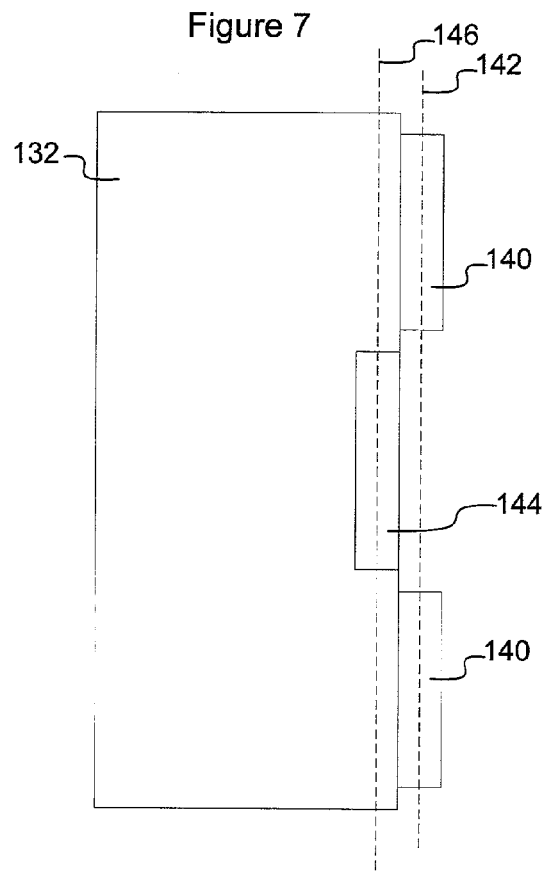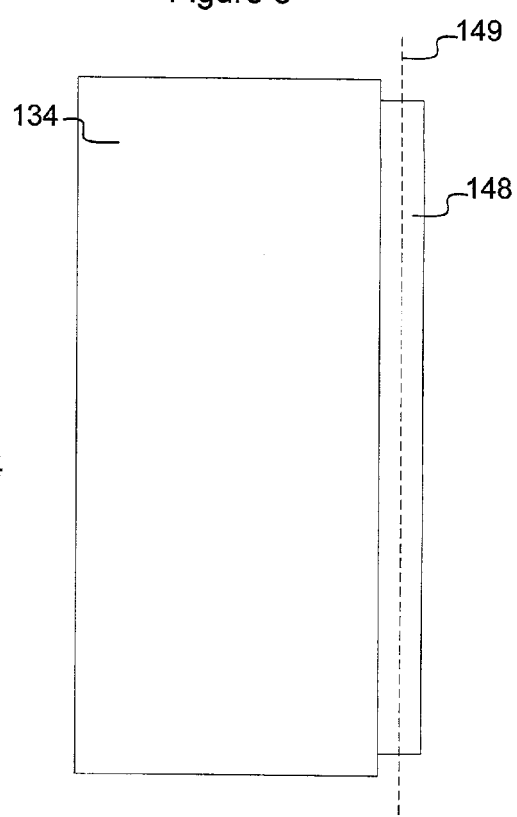

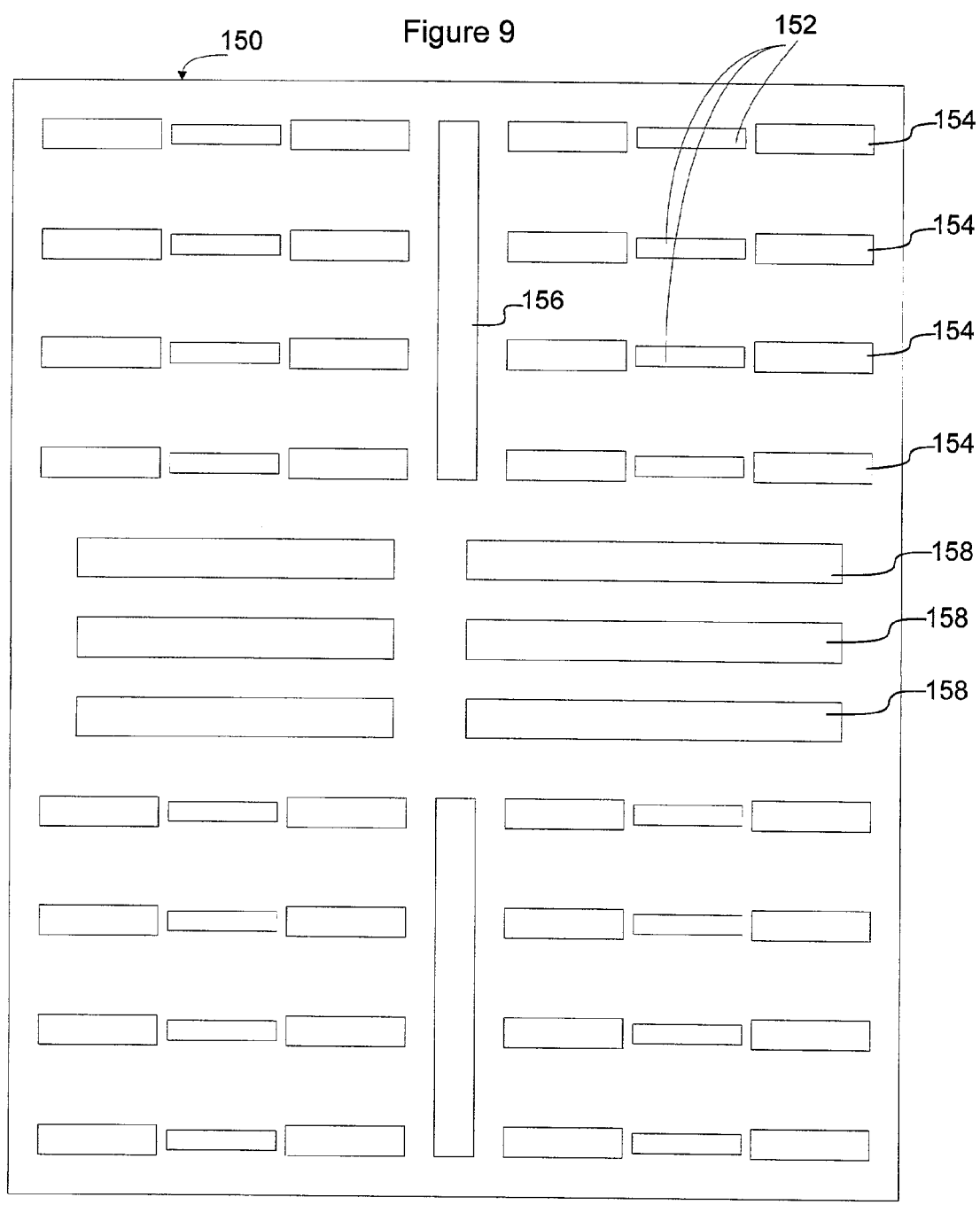

MULTIPLE COMPONENT CONNECTOR PLANE FOR A NETWORK DEVICE

BACKGROUND OF THE INVENTION

1. Field of the Invention

The present invention relates to network devices and, more particularly, to a network device having a multiple component connector plane configured to interconnect functional cards.

2. Description of the Related Art

Data communication networks may include various nodes, routers, switches, hubs, and other network devices coupled to and configured to pass data to one another. Nodes, routers, switches, hubs, and other network devices will be referred to herein as "network devices." Data is communicated through the data communication network by passing data packets (or segments or data cells) between the network devices by utilizing one or more communication links between the devices. A particular data packet may be handled by multiple network devices and cross multiple communication links as it travels between its source and its destination. Network devices are typically configured to transport data elements from one interface to another to facilitate delivery of packets over a network. Network devices are not configured to process the data and/or alter the data within the packet, except as necessary to make any required transportation decisions or perform functions related to packet transportation.

Conventional network devices include a plurality of input/output cards (I/O cards) configured to receive and output data, and a plurality of processor cards configured to process information and instruct the I/O cards how to receive and output the data. A printed circuit board forming a back plane or mid-plane is used to interconnect the I/O cards and processor cards.

As data networks have grown in complexity and speed, the network devices used in those networks have likewise increased in complexity and speed. This complexity may be manifest in many ways, including in the back-plane or mid-plane used in the network device.

Points on a printed circuit board are interconnected by traces. If traces are required to cross over each other, multiple layers of traces vertically joined by vias must be used to form the required interconnections. As the printed circuit boards forming the mid-plane or back-plane become more complex, the number of layers has concomitantly increased. This complexity results in the mid-plane or back-plane having an increasingly large number of layers.

In printed circuit board manufacturing, the greater the number of layers required to be formed on a given printed circuit board the lower the yield during manufacturing, and hence, the greater the cost of the finished product. The cost per layer is typically is not a linear function, however, because the yield associated with manufacturing a high layer count printed circuit board is often significantly lower than the yield associated with manufacturing a lower layer count printed circuit board. Hence, printed circuit boards required for network devices have grown increasingly expensive.

Additionally, there are other limitations in the printed circuit board manufacturing process that circumscribe the number of layers that can be cost effectively manufactured. One such limiting factor is the aspect ratio of the thickness of the printed circuit board to the connector hole diameter. Specifically, given a set aspect ratio, the maximum thickness of the printed circuit board will be defined by the diameter of the pins being used to connect the I/O cards and processor cards to the printed circuit board. The number of layers achievable on the printed circuit board, given the defined board thickness, may then be determined based on the material substrate technology to achieve the design layer-to-layer impedance requirements. However, as the number of interconnections between the I/O cards or processor cards, and connector plane have increased, the individual connector pins have decreased in both pitch and pin diameter, resulting in a reduced available board thickness.

SUMMARY OF THE INVENTION

The present invention overcomes these and other drawbacks by providing an apparatus and method for interconnecting multiple functional cards in a network device. In one aspect of the present invention, the network device uses a multiple component connector plane to interconnect functional cards within the network device. Each of the components of the connector plane may be configured to provide a subset of the total connectivity of the connector plane to enable it to be made in a less complex fashion. Using existing printed circuit board technology, this reduction in complexity enables lower layer count boards to be used to form the connector plane, resulting in lower overall costs. The connector plane according to the various aspects of the invention may be a back plane or a mid-plane.

According to one aspect of this invention, a network device includes a first connectivity unit adapted to interconnect with a first subset of functional cards, and a second connectivity unit adapted to interconnect with a second subset of functional cards and to interconnect with at least a portion of the first subset of functional cards. The second connectivity unit in this aspect is configured to interconnect the portion of the first subset of functional cards and the second subset of functional cards. The connectivity units may be printed circuit boards, the first subset of functional cards may be I/O cards, and the second subset of functional cards may be processor cards.

The first and second connectivity units, according to this aspect, may collectively comprise a back-plane having a total connectivity or a mid-plane having a total connectivity. In either instance, the first connectivity unit may be configured to accomplish a first portion of the total connectivity of the back plane, and the second connectivity unit may be configured to accomplish a second portion of the total connectivity of the back plane.

According to another aspect of this invention, a connector plane of a network device includes a first printed circuit board configured to connect with a first subset of functional cards having a first functionality, and at least a portion of a second subset of functional cards having a second functionality. The connector plane also has a second printed circuit board configured to connect with and interconnect the second subset of functional cards. The first subset of functional cards may be I/O cards, and the second subset of functional cards may be processor cards.

The first and second connectivity units, according to this aspect, may collectively comprise a back-plane having a total connectivity or a mid-plane having a total connectivity. In either instance, the first connectivity unit may be configured to accomplish a first portion of the total connectivity of the back plane, and the second connectivity unit may be configured to accomplish a second portion of the total connectivity of the back plane. Each connectivity unit may be formed from one or more printed circuit boards.

BRIEF DESCRIPTION OF THE DRAWINGS

Aspects of the present invention are pointed out with particularity in the appended claims. The present invention is illustrated by way of example in the following drawings in which like references indicate similar elements. The following drawings disclose various embodiments of the present invention for purposes of illustration only and are not intended to limit the scope of the invention. For purposes of clarity, not every component may be labeled in every figure. In the figures:

FIG. 4 is functional block diagram of a connector plane according to one aspect of this invention;

FIG. 5 is a functional block diagram of a side view of a mid-plane according to one embodiment of the invention;

FIG. 6 is a functional block diagram of a side view of a back-plane according to another embodiment of the invention;

FIGS. 7 and 8 illustrate functional cards for connecting to the mid-plane of FIG. 5 and/or back-plane of FIG. 6;

FIGS. 9–12 are functional block diagrams of one embodiment of a possible board layout for a mid-plane according to one embodiment of the invention;

DETAILED DESCRIPTION

The following detailed description sets forth numerous specific details to provide a thorough understanding of the invention. However, those skilled in the art will appreciate that the invention may be practiced without these specific details. In other instances, well-known methods, procedures, components, protocols, algorithms, and circuits have not been described in detail so as not to obscure the invention.

As described in greater detail below, the network device of the present invention uses a multiple component connector plane to interconnect functional cards within the network device. Each of the components of the connector plane may be configured to provide a subset of the total connectivity of the connector plane to enable it to be made in a less complex fashion. Using existing printed circuit board technology, this reduction in complexity enables lower layer count boards to be used to form the connector plane, resulting in lower overall costs. The lower layer count results in less thick boards, allowing for narrower pins and tighter pin density on the functional cards.

Figure 1:
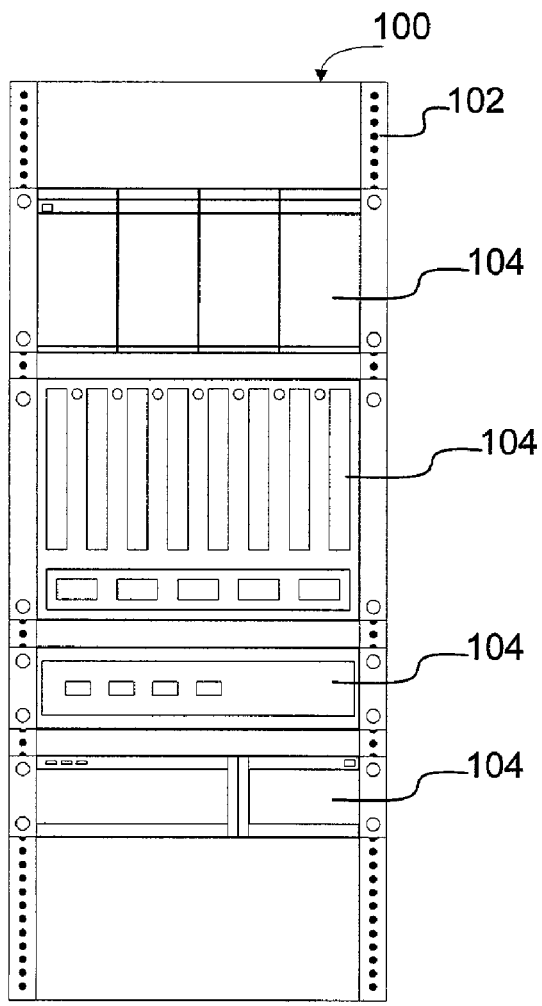
FIG. 1 is a block diagram of a rack containing network devices according to one aspect of the invention.

As shown in FIG. 1, a rack 100 is typically configured with mounting strips 102 on either side such that multiple network devices 104 may be housed in the rack 100. By vertically stacking network devices 104 in this manner, it is possible to increase the number of network devices 104 that may be housed in a given room while optionally enabling shared power distribution and other sundry benefits.

Figure 2:
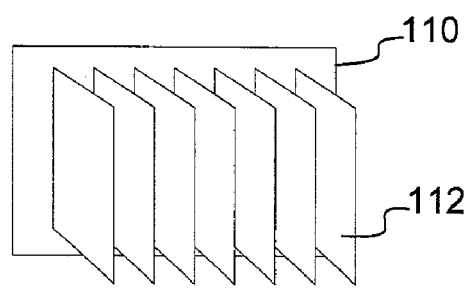
FIG. 2 is a perspective view of a back-plane with attached functional cards.
Figure 3:
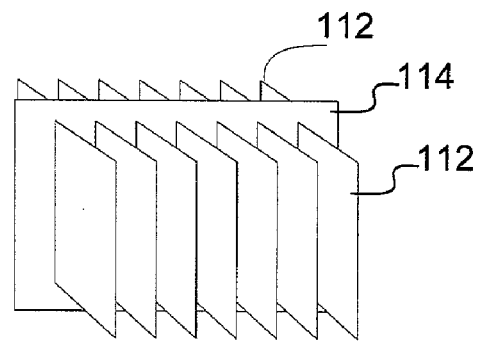
FIG. 3 is a perspective view of a mid-plane with attached functional cards.

Network devices may be configured, as shown in FIG. 2, with a back-plane 110 and functional cards 112, or, as shown in FIG. 3, with a mid-plane 114 and functional cards 112. One difference between a back-plane 110 and a mid-plane 114, is that a mid-plane 114 is configured to receive functional cards 112 on two surfaces, whereas a back-plane 110 is configured to receive functional cards 112 on only one surface. For example, in the embodiments illustrated in FIGS. 2 and 3, the back-plane 110 of FIG. 2 is configured to receive functional cards 112 on its front surface whereas the mid-plane 114 of FIG. 3 is configured to receive functional cards 112 on both its front and rear surfaces. The functional cards may all be oriented in the same direction, for example vertical as illustrated, or may be oriented in different directions relative to each other, for example both vertical and horizontal (not illustrated). As used herein, the term "connector plane" will be used to refer generically to either a back plane or a mid-plane.

An example of a hypothetical connector plane is illustrated in FIG. 4. As shown in FIG. 4, a connector plane 120 functions to interconnect connectors 122 to which functional cards may be attached. The connector plane 120 may also provide ancillary functions such as providing for power distribution to the functional cards, communications interfaces for initialization, maintenance, debug, and control of the functional cards, or any conventional ancillary functions.

In the illustrated embodiment, the connector plane 120 includes a plurality of connectors 122 interconnected by traces 124. Connectors 122 in this illustrated embodiment are configured to mate with corresponding connectors on functional cards 112 (see FIGS. 7 and 8). Depending on the desired functionality and level of connectivity, each connector 122 may be electrically coupled via traces 124 to each other connector 122, or, alternatively, may be electrically coupled via traces 124 with only a specified subset of other connectors 122. Additionally or alternatively, the connectors may be coupled to a bus 126 to allow data transfer between the connectors. While use of a bus enables greater interconnectivity between the connectors utilizing fewer traces, it also may provide a data bottleneck as data passing through the various connectors 122 will need to compete for access to the bus 126.

In one embodiment, the connector plane 120 is a printed circuit board containing traces 124 enabling connectors 122 to intercommunicate. It should be noted that although the mid-planes, back-planes, and connector planes will be described herein as being formed as printed circuit boards, the invention is not limited to this particular preferred technology, but rather extends to all technologies capable of being used in furtherance of the objectives of this invention.

In one embodiment of the invention, as shown in FIGS. 5 and 6, a connector plane (such as mid-plane 114 of FIG. 5 or back-plane 110 of FIG. 6) is constructed of two individually formed connectivity units 130. Each connectivity unit 130 is configured to accomplish a portion of the total connectivity required of the connector plane. This results in each board being concomitantly less complex than it would have been if it were required to accomplish the total connectivity for the connector plane. This reduction in complexity enables lower layer count boards to be used to form the connector plane, resulting in lower overall costs. Although only two connectivity units are illustrated, the invention is not limited in this regard as two or more connectivity units may be utilized. Likewise, although only one printed circuit board is illustrated as forming each connectivity unit, more than one printed circuit board may be utilized to form each connectivity unit (see FIG. 14).

To parse the total connectivity of the connector plane such that each connectivity unit accomplishes a portion of the total connectivity, it is necessary to logically separate the connectivity into two or more sections. In one embodiment of the invention, a logical separation may be accomplished where a plurality of layers in the connector plane perform a physical task such as rotating connectors from one orientation to another. For example, it may be desirable under certain circumstances, such as to allow easier access to the cards, to have connectors on one side of the connector plane oriented in a horizontal fashion and connectors on the other side of the connector plane oriented in a vertical fashion. It may take several or many layers on a printed circuit board to reorient the connectors so that functional units on each side of the connector plane are able to pass data to each other. A parsing is accomplished, in this embodiment, by separating the trace layers associated with connector rotation from layers associated with functional unit intercommunication. This enables one lower count printed circuit board to be used to perform the connector rotation and another lower count printed circuit board to be used to perform functional unit intercommunication.

Another way to parse the total connectivity is to look for other logical ways to separate the cards. One possible logical separation is to connect cards of similar functionality to one connectivity unit and to connect cards of another functionality to another other connectivity unit. Alternatively, or additionally, a logical separation may be formed by looking at the quantity of data traffic expected to flow between different functional units 112 and separating the functional units 112 into subsets on that basis. For example, it may be that functional cards in a first subset communicate primarily or exclusively with other functional cards in that first subset, and that functional cards in a second subset communicate primarily or exclusively with other functional cards in the second subset.

Separating the connector plane into two or more individually formed connectivity units prevents functional cards 112 on one connectivity unit 130 from communicating directly with functional cards 112 on the other connectivity unit 130. If communication between the subsets of functional cards 112 is necessary in the network device, an interconnection between the connectivity units 130 is required. In the embodiment illustrated in FIG. 5, one subset of functional cards 112 is connected with both connectivity units 130 to enable data to be exchanged from connectivity unit 130b to 130a.

According to one embodiment of the invention, in a network device configured to receive data traffic and switch or route the data traffic to other network devices, one logical separation is to interconnect the functional units 112 performing processing (referred to herein as processor cards 132) on one connectivity unit 130a, and to interconnect the functional units 112 performing input and output functions (referred to herein as I/O cards 134) on another connectivity unit 130b. This is not the only possible logical separation and the invention is not limited to this particular logical separation.

A more detailed view of an example of a functional unit is shown in FIG. 7. As illustrated in FIG. 7, a processor card 132 has a first set of connectors 140 designed to mate with corresponding connectors in a first plane 142 of a first printed circuit board and a second set of connectors 144 designed to mate with connectors in a second plane 146 of a second printed circuit board. The first and second planes 142, 146, correspond with the second and first connectivity units 130 discussed above with respect to FIG. 5. Notably, the second set of connectors 140 extend further from the processor card 132 to enable those connectors to extend through holes 154 in the first connectivity unit 130a and interconnect with connector 150 on connectivity unit 130b.

An example of an I/O card 134 is illustrated in FIG. 8. As shown in FIG. 8, it is possible to have one or more connectors 148 configured to connect with a connectivity unit 130 in a single plane 149, since the I/O card 134 of this embodiment, given its desired functionality, is required only to interconnect with one of the connectivity units 130.

The invention is not limited to specific configuration illustrated in FIGS. 7 and 8, but also extends to the opposite configuration where the processor card connects to one or more connectivity units in a single plane and the I/O card connects to one or more connectivity units in multiple planes. Alternatively, optionally, both types of functional units may be configured to connect to multiple connectivity units in multiple planes.

Figure 13:
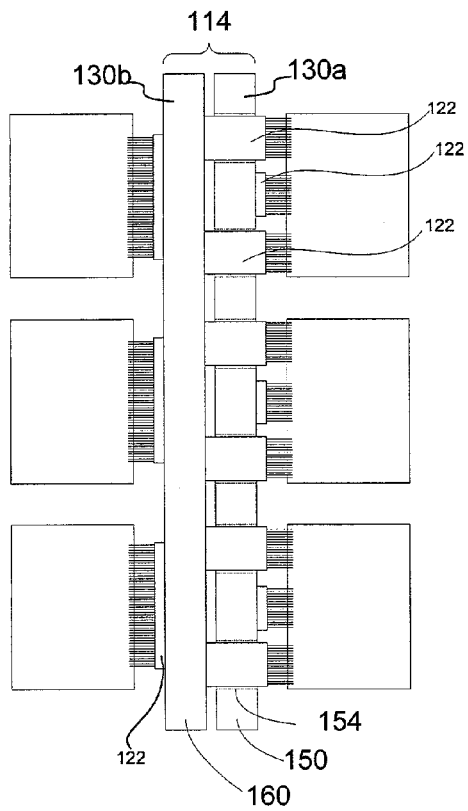
FIG. 13 is a functional block diagram of a side view of a connector plane according to another embodiment of the invention.

FIG. 13 illustrates another embodiment of the invention. As shown in FIG. 13, in one embodiment the connectors 122 on the connectivity units 130a, 130b may be formed at different heights to enable the connectors from one of the connectivity units to depend through the apertures in the other connectivity unit. By forming the connectors in such a manner, the functional units may communicate with both connectivity units in a single plane.

Figure 14:
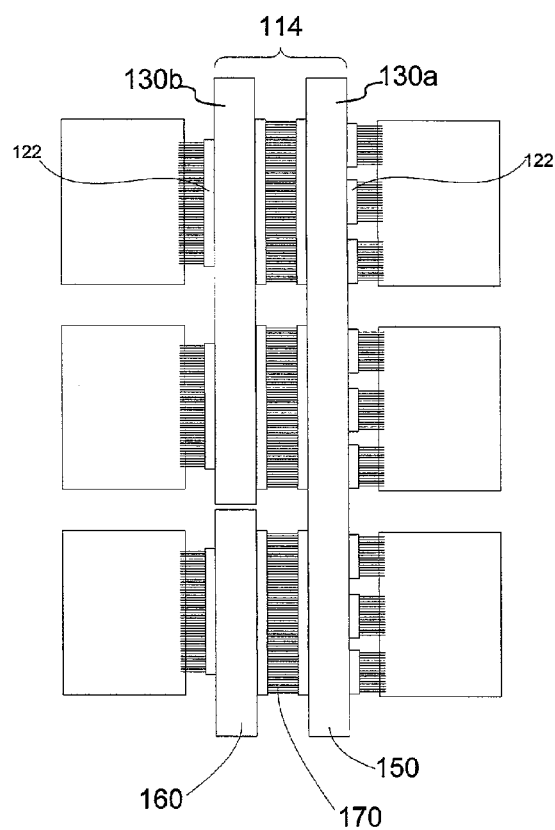
FIG. 14 is a functional block diagram of a side view of a connector plane according to yet another embodiment of the invention.

FIG. 14 illustrates yet another embodiment of the invention. As shown in FIG. 14, in this embodiment of the invention the connectivity units 130a, 130b, may be connected directly to each other by inter-board connectors 170 that form an interface between the two connectivity units 130a, 130b.

FIGS. 9–12 illustrate, in greater detail, one example of how a mid-plane according to one embodiment of the invention may be configured. In this example, the connectivity units 130 are printed circuit boards and will be referred to as such, although the invention is not limited to connectivity units formed as printed circuit boards.

FIG. 9 illustrates a top surface of a first printed circuit board 150 having a plurality of connectors 152 configured to mate with connectors 144 on processor card 132 (see FIG. 7). Printed circuit board 150 also has a plurality of apertures 154 configured to admit passage of the extending set of connectors 140 (see FIG. 7). In the example illustrated in FIG. 9, the printed circuit board 150 also has apertures 156 configured to admit passage of other processing cards. Additionally, printed circuit board 150 also has a plurality of connectors 158 adapted and configured to accept other processing cards that may provide redundant or additional functionality to the processor cards 132. Although the printed circuit board 150 of the example illustrated in FIG. 9 includes the additional apertures 156 and connectors 158, the invention is not limited in this manner, as any number, including zero, of additional apertures 156 or connectors 158 may be provided on the printed circuit board 150.

In this embodiment, the bottom side of printed circuit board 150 (not separately illustrated) does not contain any additional connectors or apertures not illustrated in FIG. 9. The invention is not limited in this aspect, however, as the bottom side of printed circuit board 150 may contain additional connectors to enable it to connect directly with the printed circuit board 160 (see FIG. 14) or to connect with connectors of functional units extending through apertures (not shown) in the second printed circuit board 160 (illustrated in FIG. 10).

Figure 10:
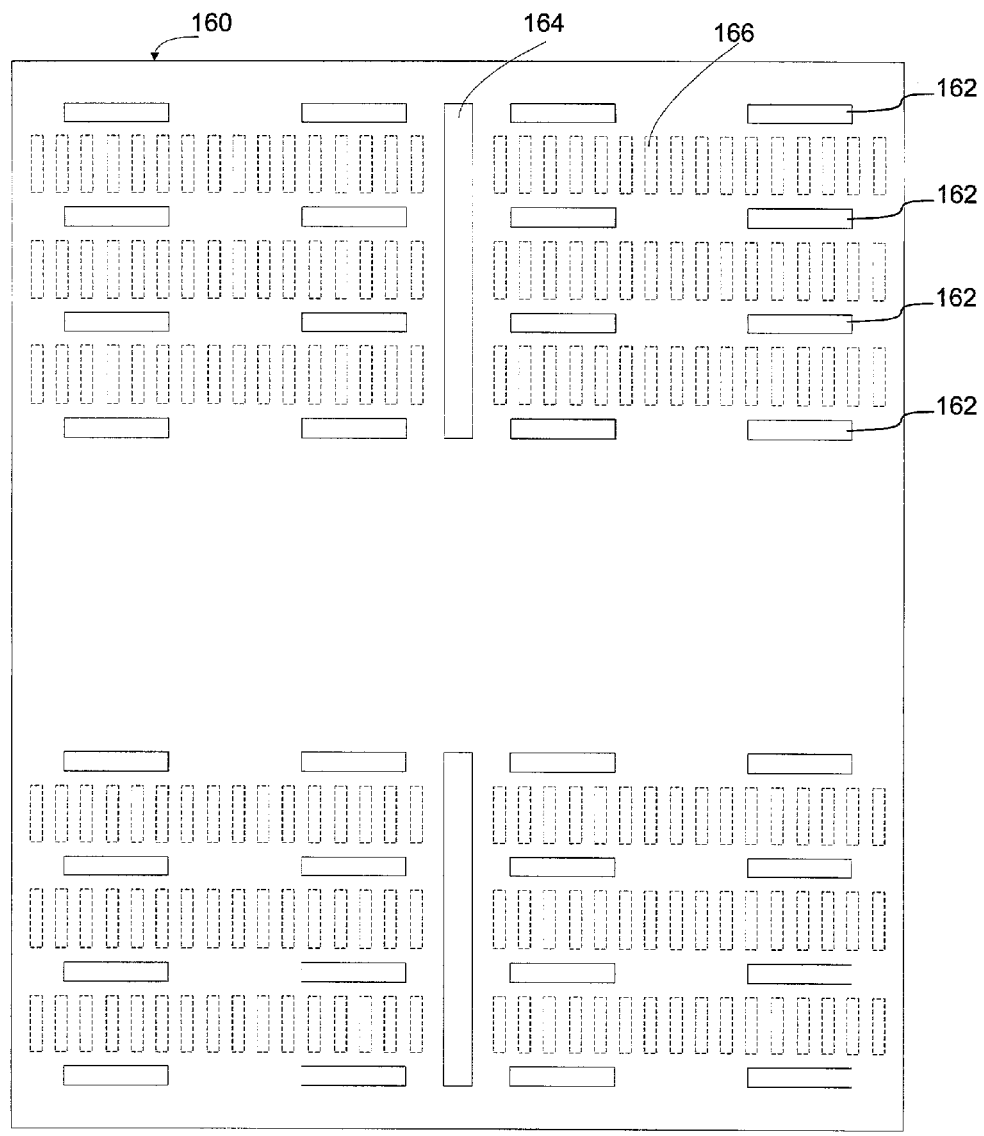
Figure 11:
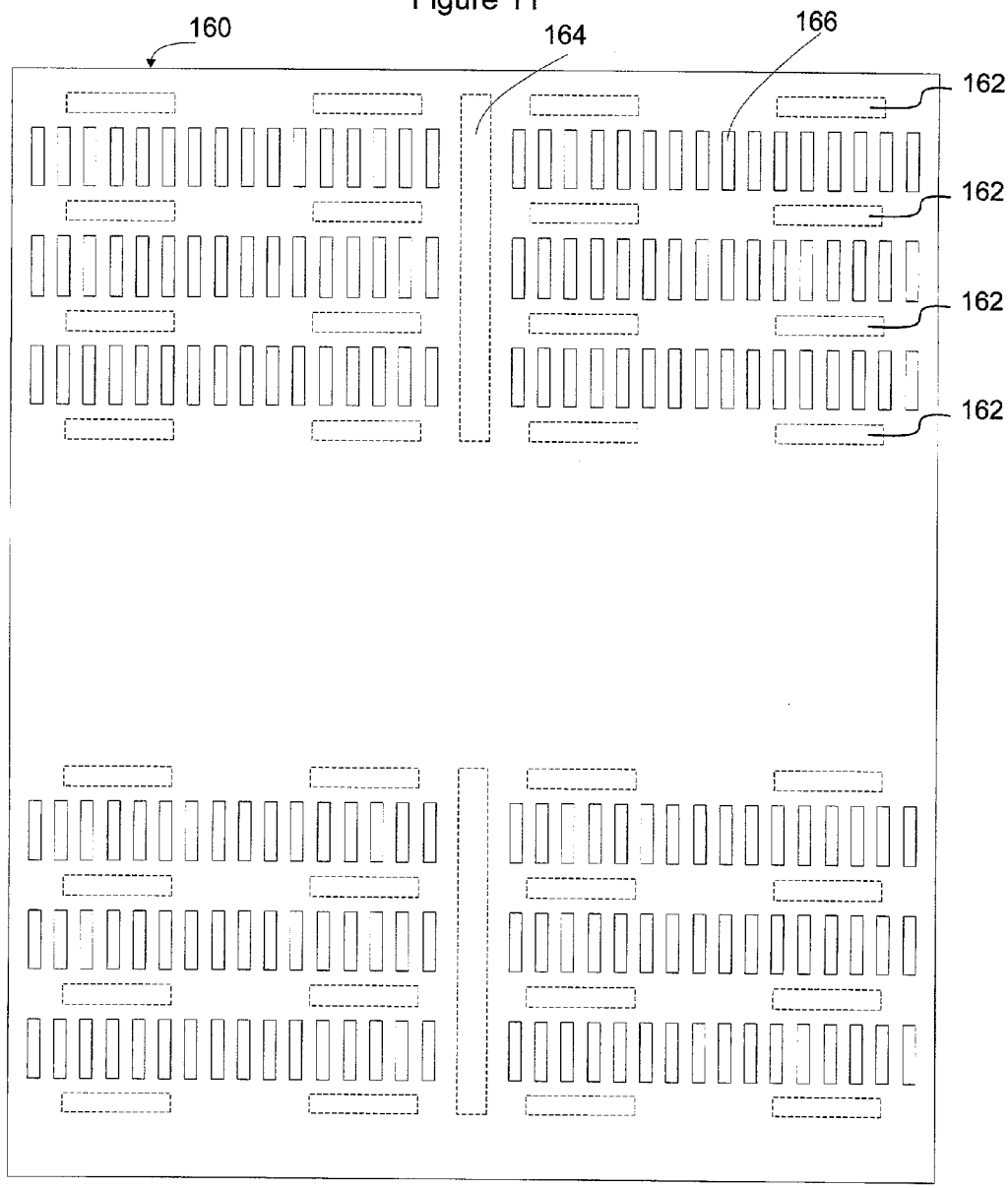

FIG. 10 illustrates a first surface of a second printed circuit board 160 having a plurality of connectors 162 configured to mate with connectors 140 on processor card 132 (see FIG. 7). The second (back) surface of the second printed circuit board 160 is illustrated in FIG. 11. As with first printed circuit board 150 of FIG. 9, the second printed circuit board 160 may optionally include connectors 164 configured to mate with any desired additional processing cards passing through apertures 156 in first printed circuit board 150 and may contain additional connectors or apertures to enable interconnection of functional units with the printed circuit boards.

Printed circuit board 160 also has a plurality of connectors 166 on a second surface 168 configured to interconnect with I/O cards 34 (see FIG. 8 and FIGS. 5–6). The connectors illustrated in dashed lines in the figures are formed on the opposite surface to the particular surface being shown in that figure.

Figure 12:
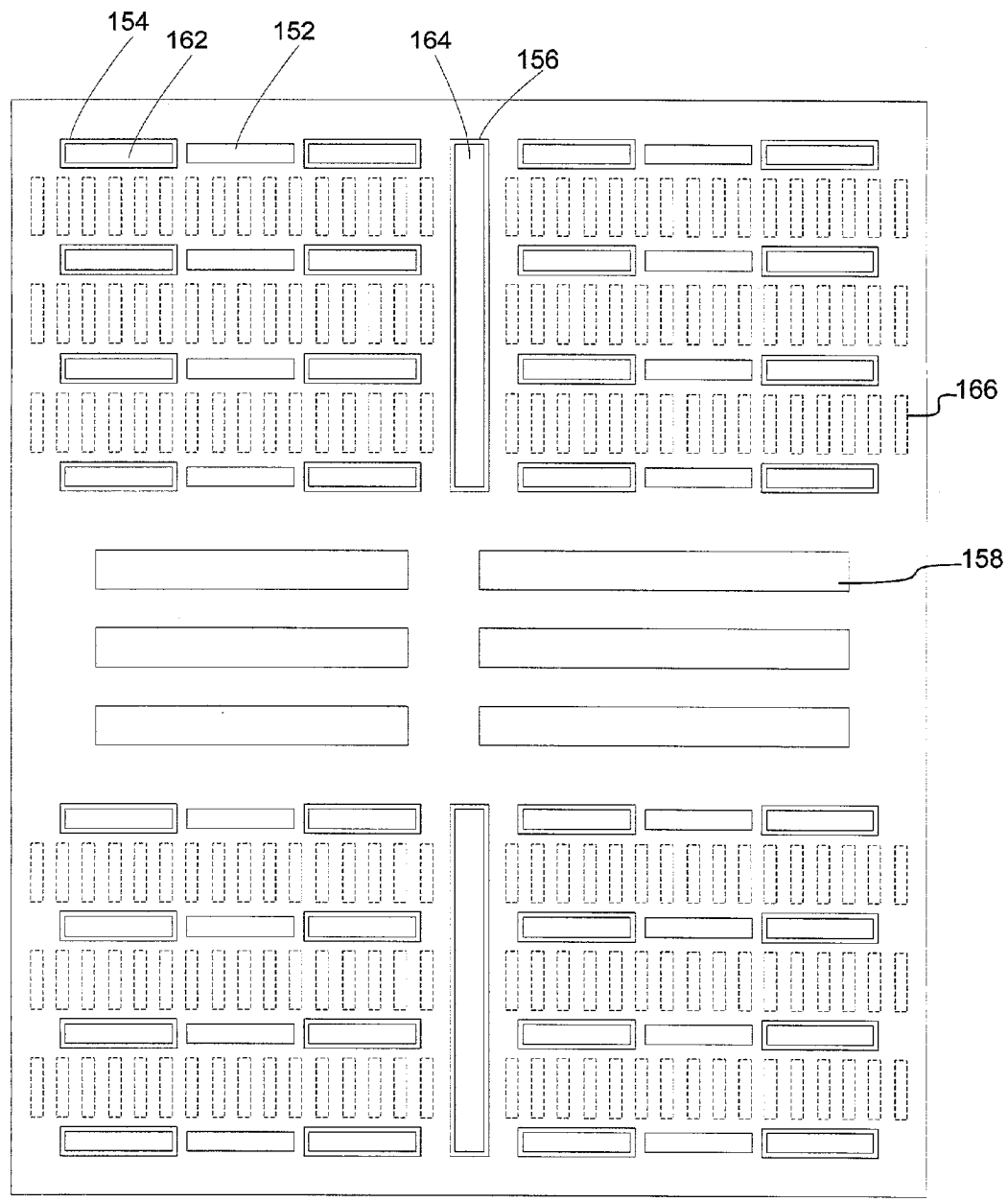

As shown in greater detail in FIG. 12, the printed circuit boards 150, 160 are configured such that the connectors 162 on the second printed circuit board 160 are disposed below the apertures 154 in the first printed circuit board 150 when assembled to form a connector plane. The coordination between apertures and connectors is also illustrated in FIGS. 5 and 6, each of which illustrate connectors 144 passing through apertures 154 in printed circuit board 150 and mating with connectors 162 on printed circuit board 160.

Since the functional cards, in this example processor cards, are required to interconnect with connectors on two individually formed printed circuit boards, it may be necessary to monitor the connector placement on the printed circuit boards more closely. Additionally, the alignment between the two printed circuit boards should be monitored so that the connectors interconnecting to the two printed circuit boards are aligned as if they were situated on the same substrate. Any added costs associated with increased precision in alignment should be more than offset, however, by the reduced costs associated with the reduced layer counts in the individual boards.

It should be noted that many of the connectors 152, 162, and apertures 154 illustrated in FIGS. 9–12 are similar. The similarity stems from the fact that in many network devices a plurality of functional units of like functionality will be plugged into any given connector plane. The invention is not limited in this respect, however, and there is no requirement that all or some of the functional units be identical or perform in a fashion similar to each other.

It should be understood that various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A network device, comprising:
   a first connectivity unit having a first set of connectors configured to connect to a first subset of functional cards; and
   a second connectivity unit having a second set of connectors configured to connect to a second subset of functional cards and a third set of connectors configured to at least a portion of the first subset of functional cards while the portion of the first subset of functional cards are also connected to the first connectors, said second connectivity unit being configured to interconnect said portion of the first subset of functional cards and said second subset of functional cards.

2. The network device of claim 1, wherein the first connectivity unit and second connectivity unit collectively comprise a back-plane having a total connectivity.

3. The network device of claim 2, wherein the first connectivity unit is configured to accomplish a first portion of the total connectivity of the back plane, and
   wherein the second connectivity unit is configured to accomplish a second portion of the total connectivity of the back plane.

4. The network device of claim 1, wherein the first connectivity unit and second connectivity unit collectively comprise a mid-plane having a total connectivity.

5. The network device of claim 4, wherein the first connectivity unit is configured to accomplish a first portion of the total connectivity of the mid-plane, and
   wherein the second connectivity unit is configured to accomplish a second portion of the total connectivity of the mid-plane.

6. The network device of claim 1, wherein functional cards of the second subset of functional cards communicate primarily with other functional cards of the second subset of functional cards.

7. The network device of claim 1, wherein the first connectivity unit is a first printed circuit board and the second connectivity unit is a second printed circuit board.

8. The network device of claim 1, wherein each functional card of the first subset of functional cards is an I/O card.

9. The network device of claim 1, wherein each functional card of the second subset of functional cards is a processor card.

10. The network device of claim 1, wherein the first connectivity unit has a front side and a back side; the second connectivity unit has a front side and a back side; and wherein the back side of the first connectivity unit is configured to be disposed adjacent the back side of the second connectivity unit.

11. The network device of claim 10, wherein the first set of connectors is disposed on the front side of the first connectivity unit; wherein the second set of connectors is disposed on the front side of the second connectivity unit; and wherein the third set of connectors is disposed on the back side of the second connectivity unit.

12. A network device, comprising:
   a first connectivity unit adapted to interconnect with a first subset of functional cards; and
   a second connectivity unit adapted to interconnect with a second subset of functional cards and to interconnect with at least a portion of the first subset of functional cards, said second connectivity unit being configured to interconnect said portion of the first subset of functional cards and said second subset of functional cards;
   wherein the first connectivity unit has a front side and a back side; the second connectivity unit has a front side and a back side; and wherein the back side of the first connectivity unit is configured to be disposed adjacent the back side of the second connectivity unit;
   wherein the first connectivity unit has a plurality of connectors disposed on its front side configured to interconnect with said first subset of functional cards; wherein the second connectivity unit has a plurality of connectors disposed on its front side configured to interconnect with said second subset of functional cards; and wherein the first connectivity unit has a plurality of connectors disposed on its back side configured to interconnect with said portion of said second subset of functional cards; and wherein the second connectivity unit further includes a plurality of apertures configured to allow passage through said second connectivity unit of connectors depending from said portion of the second subset of functional cards.

13. A connector plane of a network device, comprising:
a first printed circuit board configured to connect with a first subset of functional cards having a first functionality and to connect with at least a portion of a second subset of functional cards having a second functionality; and
a second printed circuit board configured to connect with and interconnect said second subset of functional cards;
wherein the first and second printed circuit boards are configured to both connect to at least some of the functional cards forming the portion of the second subset of functional cards.

14. The connector plane of claim 13, wherein at least a portion of said first subset of functional cards are I/O cards.

15. The connector plane of claim 13, wherein at least a portion of said second subset functional cards are processor cards.

16. The connector plane of claim 13, wherein said first printed circuit board has a first side and a second side, said first side of said first printed circuit board being adopted to receive said plurality of first functional cards; wherein said second printed circuit board has a first side and a second side, said first side of said second printed circuit board being adopted to receive said plurality of second functional cards; and wherein said first and second printed circuit boards are configured to be arranged within said network device such that said second side of said first printed circuit board is adjacent said second side of said second printed circuit board.

17. The connector plane of claim 16, wherein said second printed circuit board contains apertures configured to enable at least a portion of one or more of said second functional cards to interconnect with said first printed circuit board.

18. The connector plane of claim 13, wherein the functional cards of the first subset of functional cards are logically separated from the functional cards of the second subset of functional cards.

19. The connector plane of claim 13, wherein the first connectivity unit and second connectivity unit collectively comprise a back-plane having a total connectivity;
wherein the first connectivity unit is configured to accomplish a first portion of the total connectivity of the back plane; and
wherein the second connectivity unit is configured to accomplish a second portion of the total connectivity of the back plane.

20. The connector plane of claim 13, wherein the first connectivity unit and second connectivity unit collectively comprise a mid-plane having a total connectivity;
wherein the first connectivity unit is configured to accomplish a first portion of the total connectivity of the mid-plane; and
wherein the second connectivity unit is configured to accomplish a second portion of the total connectivity of the mid-plane.

* * * * *

UNITED STATES PATENT AND TRADEMARK OFFICE
CERTIFICATE OF CORRECTION

| | | |
|---|---|---|
| PATENT NO. | : 7,123,486 B1 | Page 1 of 1 |
| APPLICATION NO. | : 10/128872 | |
| DATED | : October 17, 2006 | |
| INVENTOR(S) | : Paul John Koens and Martin Leslie White | |

It is certified that error appears in the above-identified patent and that said Letters Patent is hereby corrected as shown below:

Col. 7, line 55,

Change Claim 1 from:

1. A network device, comprising:
    a first connectivity unit having a first set of connectors configured to connect to a first subset of functional cards; and
    a second connectivity unit having a second set of connectors configured to connect to a second subset of functional cards and a third set of connectors configured to at least a portion of the first subset of functional cards while the portion of the first subset of functional cards are also connected to the first connectors, said second connectivity unit being configured to interconnect said portion of the first subset of functional cards and said second subset of functional cards.

to:

1. A network device, comprising:
    a first connectivity unit having a first set of connectors configured to connect to a first subset of functional cards; and
    a second connectivity unit having a second set of connectors configured to connect to a second subset of functional cards and a third set of connectors configured to connect to at least a portion of the first subset of functional cards while the portion of the first subset of functional cards are also connected to the first connectors, said second connectivity unit being configured to interconnect said portion of the first subset of functional cards and said second subset of functional cards.

Signed and Sealed this

Tenth Day of April, 2007

JON W. DUDAS
*Director of the United States Patent and Trademark Office*